(12) United States Patent
Joe

(10) Patent No.: US 7,326,655 B2
(45) Date of Patent: Feb. 5, 2008

(54) METHOD OF FORMING AN OXIDE LAYER

(75) Inventor: Raymond Joe, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/237,866

(22) Filed: Sep. 29, 2005

(65) Prior Publication Data

US 2007/0072438 A1    Mar. 29, 2007

(51) Int. Cl.
H01L 21/31    (2006.01)

(52) U.S. Cl. ............ 438/774; 438/773; 257/E21.284

(58) Field of Classification Search ........ 438/769–770, 438/773–774; 257/E21.284
See application file for complete search history.

(56) References Cited

U.S. PATENT DOCUMENTS

| | | | |
|---|---|---|---|
| 5,319,235 A | 6/1994 | Kihara et al. | |
| 6,037,273 A | 3/2000 | Gronet et al. | |
| 6,297,172 B1 | 10/2001 | Kashiwagi | |
| 6,352,941 B1 | 3/2002 | Hwang et al. | |
| 6,410,456 B1 | 6/2002 | Gronet et al. | |
| 6,423,648 B2 | 7/2002 | Hwang et al. | |
| 6,599,845 B2 | 7/2003 | Sato et al. | |
| 6,674,138 B1 * | 1/2004 | Halliyal et al. | 257/411 |
| 6,835,672 B1 | 12/2004 | Park et al. | |
| 6,869,892 B1 | 3/2005 | Suzuki et al. | |
| 2001/0020724 A1 | 9/2001 | Berry et al. | |
| 2004/0115936 A1 * | 6/2004 | DePetrillo et al. | 438/689 |
| 2007/0063277 A1 * | 3/2007 | Belyansky et al. | 257/347 |

OTHER PUBLICATIONS

Sullivan et al., Exploring ISSG Process Space, 9th Int. Conference on Advanced Thermal Processing of Semiconductors-RTP, 2001, p. 95-110.
Chen et al., "Cycle Time and Process Improvement by Single Wafer Thermal Processing in Production Enviornment", 10th IEEE International Conference on Advanced Thermal Processing of Semiconductors-RTP, 2002, p. 171-176.
De Almeida et al., "Thermal Growth of Silicon Oxynitride Films on Si: A Reaction-Diffusion Approach," J. Appl. Phys. vol. 95 (4), 2004, p. 1770-1773.
Kim et al., Thermal Oxynitridation of Silicon in N2O Ambients, J. Electrochem. Soc, vol. 143 (10), 1996, p. 3372-3376.
Liu et al., "The Oxidation Mechanism of Low-Pressure Dry Oxidation of Nitrates for Memory Devices," J. Electrochem Soc. vol. 144 (9), 1997, p. 3288-3293.

(Continued)

Primary Examiner—Thanhha S. Pham
(74) Attorney, Agent, or Firm—Oblon, Spivak, McClelland, Maier & Neustadt, P.C.

(57) ABSTRACT

A method for forming an oxide layer on a substrate. The method includes exposing a process gas containing $H_2$, an oxygen-containing gas, and a halogen-containing oxidation accelerant gas to the substrate, where the process chamber is maintained at a subatmospheric pressure, and forming an oxide layer through thermal oxidization of the substrate by the process gas. According to one embodiment of the invention, the substrate can be maintained at a temperature between about 150° C. and about 900° C. A microstructure containing an oxide layer is described, where the oxide layer can be a gate dielectric oxide layer or an interface oxide layer integrated with a high-k layer.

21 Claims, 5 Drawing Sheets

OTHER PUBLICATIONS

Oh et al., Effect of HCI on Silicon Point Defect Formation During Thermal Oxidation of (100) Float Zone Silicon Wafers, Appl. Phys. Letters, vol. 48 (17), 1986, p. 1125-1126.

Hattori, "HCI Oxidation Conditions for Stacking-Fault Nuclei Gettering and for Silicon Etching", J. Appl. Phys., vol. 49 (5), 1978, p. 2994-2995.

Lu et al., "An Investigation of the Properties of Silicon Oxide Prepared by Oxidation of Silicon in Chlorine-Containing Ambients at 850C", Matterials Letters, vol. 38, 1999, p. 308-312.

Hess & Deal, "Kinetics of the Thermal Oxidation of Silicon in O2/HCI Mixtures", J. Electrochem Soc., 1977, p. 735-739.

Das et al., "A Comparison of HCI- and Trichloroethylene-Grown Oxides on Silicon", J. Electrochem Soc., 1984, p. 389-391.

Osburn et al., "Silicon Gate Oxide Thickness Uniformity During HCI Oxidation", J. Electrochem Soc., vol. 138, #1, 1991, p. 268-276.

Van der Meulen & Cahill, "Effects of HCI and Ci2 Additions on Silicon Oxidation Kinetics", J. Electronic Mater., vol. 3#2, 1974, p. 371-389.

Osburn, "Dielectric Breakdown Properties of SiO2 Films Grown in Halogen and Hydrogen-Containing Enviornment", J. Electrochem Soc., 1974, p. 809-814.

Kriegler et al., "The Effect of HCI and Ci2 on the Thermal Oxidation of Silicon", J. Electrochem Soc., 1972, p. 388-392.

Ehara et al., "Kinetics and Oxide Properties of Silicon Oxidation in O2-H2-HCI Mixtures", J. Electrochem Soc., 1979, p. 2249-2253.

Jallouli et al. "Fe-Cr-Al Alloy, High Temperature Corrosion in Sulfur Vapor", J. Electrochem Soc., 1979 p. 2254.

Simko, et al., "Removal of Fluorocarbon Residues on $CF_4/H_2$ Reactive-Ion-Etched Silicon Surfaces Using a Hydrogen Plasma", J. Electrochem Soc, vol. 138,(1) , 1991, p. 277.

K. Ehara, et al. "Kinetics and Oxide Properties of Silicon Oxidation in $O_2$-$H_2$-HCL Mixtures", Japanese Electrochemical Society, vol. 126, No. 12, Dec. 1979, pp. 2249-2253.

C.M. Osburn, "Dielectric Breakdown Properties of $SiO_2$ Films Grown in Halogen and Hydrogen-Containing Environments", Japanese Electrochemical Society, vol. 121, No. 6, Jun. 1974, pp. 809-814.

Chang, I.F., "Synthesis of Photochromic and Cathodochromic Sodalite," J. Electrochem, Soc: Solid-State Science and Technology, Jun. 1974, pp. 815-820.

Janus, Alan R., "Chemical Etch Rate Studies on Sputtered Chromium Films," J. Electrochem. Soc.: Solid-State Science and Technology, Mar. 1972, pgs. 392-396.

Albers, John, "The Relation Between Two-Probe and Four-Probe resistances on Nonuniform Structures," J. Electrochem. Soc.: Solid-State Science and Technology, Feb. 1984, pp. 392-398.

* cited by examiner

METHOD OF FORMING AN OXIDE LAYER

FIELD OF THE INVENTION

The present invention relates to semiconductor processing, and more particularly, to utilizing a halogen-containing oxidation accelerant gas to form an oxide layer through thermal oxidation of a substrate.

BACKGROUND OF THE INVENTION

Thin oxide layers are commonly used as dielectric layers at a surface of an integrated circuit. This is in part because of good electrical properties of the oxide layers, including high electron mobility and low electron trap densities.

Low pressure radical oxidation (LPRO) of substrates is a known method for reliably forming oxide layers with excellent electrical properties. Further, LPRO provides excellent non-selectivity of the oxide growth among planar and irregular substrate surfaces. However, LPRO requires high processing temperatures in order to provide practical oxidation rates for device manufacturing. As circuit geometries shrink to ever smaller feature sizes and new materials are introduced into semiconductor devices, the thermal budget of many manufacturing processes is reduced. Thus, despite its benefits, LPRO processes have not been utilized in the manufacturing of low feature size devices, or other processes requiring low thermal budget.

SUMMARY OF THE INVENTION

Accordingly, an object of the present invention is to address the above-described and/or other problems related to thermal oxide growth.

Another object of the present invention is to provide a low temperature oxidation process for forming an oxide with good electrical properties at a growth rate practical for device manufacturing.

Any of these and/or other objects can be provided by a method for forming an oxide layer through thermal oxidation of a substrate in accordance with the present invention. The oxide layer can, for example, be used as a gate dielectric oxide layer or as an interface oxide layer integrated with a high dielectric constant material.

In one embodiment of the invention, the method includes exposing $H_2$, an oxygen-containing gas, and a halogen-containing oxidation accelerant gas to the substrate, while the process chamber is maintained at a subatmospheric pressure. An oxide layer is then formed through thermal oxidization of the substrate by the process gas.

In another embodiment of the invention, the method includes providing a Si substrate in a process chamber, exposing a process gas comprising $H_2$, $O_2$, and a $Cl_2$ oxidation accelerant gas to the substrate, wherein the substrate is maintained at a temperature between about 150° C. and about 900° C. and the process gas pressure is maintained between about 100 mTorr and about 650 Torr during the exposing. An $SiO_2$ or $SiO_x$ layer through thermal oxidization of the Si substrate by the process gas.

According to one embodiment of the invention, a microstructure is provided. The microstructure contains a substrate, a gate stack on the substrate, where the gate stack includes a gate electrode layer, and an gate dielectric oxide layer formed through thermal oxidation of the substrate by exposing the substrate to a process gas comprising $H_2$, an oxygen-containing gas, and a halogen-containing oxidation accelerant gas, where the process gas is maintained at a subatmospheric pressure during the exposing. According to another embodiment of the invention, the gate dielectric oxide layer can be an interface oxide layer integrated with a high-k layer.

DETAILED DESCRIPTION OF SEVERAL EMBODIMENTS OF THE INVENTION

Figure 1:
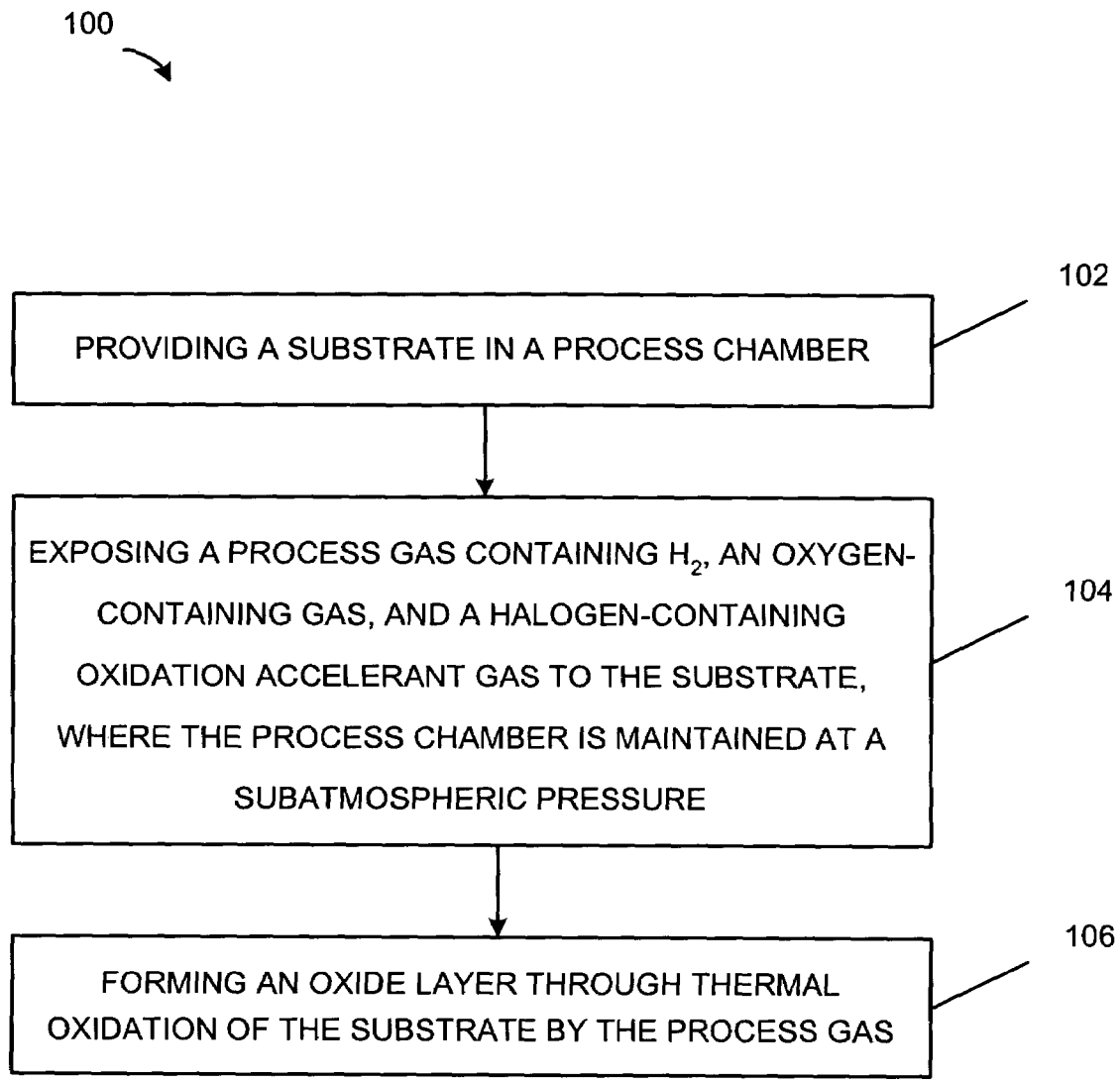
FIG. 1 is a process flow diagram of a method of forming an oxide layer according to an embodiment of the invention.

As noted above, the benefits of LPRO grown oxides have gone largely unrealized in substrate processes requiring a low thermal budget, such as production of small featured devices. Specifically, a substrate temperature of about 900° C., or higher, may be required for a conventional LPRO process performed at subatmospheric pressures (e.g., below about 10 Torr) utilizing a process gas containing $H_2$ and $O_2$. For example, in the in-situ steam generation (ISSG) oxidation technique, $H_2$ and $O_2$ are directly introduced into a process chamber without pre-combustion. The combustion-like reactions between $H_2$ and $O_2$ occur at the substrate surface at over 900° C. to produce gas-phase radicals that readily react with and oxidize the substrate. Possible active oxidation species are OH radicals, O radicals, and atomic O. However, such temperatures during growth of an interface oxide or gate dielectric oxide can cause unwanted diffusion of previously formed impurity regions, for example.

Based on the above problem, the present inventors have studied the chemical interaction of oxygen containing gasses and hydrogen containing gasses during a thermal oxidation process at subatmospheric pressure. In particular, the present inventors studied the effect of introducing a halogen containing gas as a third reactant in the oxidation process. While halogens have been previously used in oxidation growth, they have been typically used at atmospheric pressure, or as part of an oxygen or hydrogen containing gas in a two reactant process.

Based on the above studies, the present inventors discovered that when interacting with a heated substrate, the halogen-containing gas can form halogen-containing radicals that can subsequently catalyze formation of oxidation species from $H_2$ and/or the oxygen-containing gas. The activation energy for radical formation from the halogen-containing oxidation accelerant gas being lower than for $H_2$ and/or the oxygen-containing gas, along with low activation energy for the subsequent reaction of the halogen-containing radical with $H_2$ and/or the oxygen-containing gas to form H and O radicals is thought to lower the overall activation energy of the oxidation process. Thus, the use of a halogen-containing gas in combination with $H_2$ and an oxygen-containing gas accelerates the oxidation process thereby allowing for oxidizing the substrate at low substrate temperatures In one example, the process gas can contain $H_2$, $O_2$, and $Cl_2$ oxidation accelerant gas. $Cl_2$ can react on the heated substrate surface to form Cl radicals that further react with $H_2$ to form HCl and H radicals. The HCl and the H radicals may further react with $O_2$ to form additional oxidation species such as O radicals in the process gas. This effect can provide sufficient oxidation growth at subatmospheric pressure at a substrate temperature of about 150°-900° C. Furthermore, it is contemplated that the HCl and the Cl radicals may help trap and deactivate metal contaminant ions on the substrate surface that can be detrimental to the oxidation process. In addition, the in-situ formation of HCl from Cl radicals and $H_2$ can be utilized to improve oxidation selectivity of Si relative to SiN.

Thus, embodiments of the invention provide a method for efficient substrate oxidation for semiconductor device manufacturing. The method may be implemented into current semiconductor device manufacturing without significant hardware modifications. According to an embodiment of the invention, a halogen-containing oxidation accelerant gas is added to $H_2$ and an oxygen-containing gas to reduce the substrate temperature required to achieve an acceptable oxidation rate of the substrate. The presence of the halogen-containing oxidation accelerant gas in the process gas increases the oxidation rate of the substrate and thereby allows for forming a high quality oxide layer with good electrical properties at relatively low substrate temperature.

According to an embodiment of the invention, one or more substrates are provided in a process chamber, a process gas comprising $H_2$, an oxygen-containing gas, and a halogen-containing oxidation accelerant gas is exposed to the substrate, where the process gas is maintained at a subatmospheric pressure during the exposing, and an oxide layer is formed through thermal oxidation of the substrate by the process gas. According to one embodiment of the invention, the substrate may be maintained at a temperature between about 150° C. and about 900° C. during the exposing. Alternately, the substrate may be maintained at a temperature between about 400° C. and about 800° C. Still alternately, the substrate may be maintained at a temperature between about 600° C. and about 800° C. Yet alternately, the substrate may be maintained at a temperature between about 400° C. and about 600° C. However, temperatures above 900° C. may also be used, for example if oxidation rates higher than that of normal LPRO processes are needed.

These methods provide for forming an oxide layer through thermal oxidation of a substrate. The oxide layer may be utilized as a dielectric layer in semiconductor microstructures, for example, as a gate dielectric oxide layer in a gate stack or as an interface oxide layer positioned integrated with a high-k material. The oxide layer can be ultra thin, for example of the order of few angstrom (angstrom=$10^{-10}$ m).

Figure 3A:
FIGS. 3A-3B schematically show a cross-sectional view of forming an oxide layer according to an embodiment of the invention.
Figure 3B:
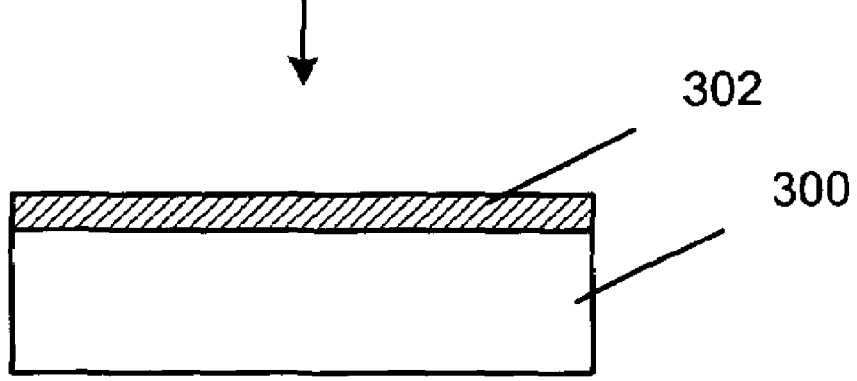

Referring now to the drawings, FIG. 1 is a process flow diagram for forming an oxide layer according to an embodiment of the invention. Reference is also made to FIGS. 3A-3B that schematically show a cross-sectional view of forming an oxide layer according to an embodiment of the invention. In FIG. 1, in step 102 of the process 100, a substrate 300 is provided in a process chamber of a processing system. The substrate 300 can, for example, contain Si, Ge, SiGe, or GaAs, and can contain at least one active region. In one example, a Si substrate can be of n- or p-type, depending on the type of device being formed. The substrate (wafer) can be of any size, for example a 200 mm substrate, a 300 mm substrate, or an even larger substrate.

Although not shown in FIG. 3A, the substrate 300 can be cleaned of a native oxide layer prior to growing an oxide layer on the substrate 300. The substrate 300 can be cleaned, for example, by placing it in a liquid bath containing dilute hydrofluoric acid (HF) or, alternatively, exposing it to HF gas phase etching. The dilute HF liquid solution can be a $H_2O$:HF (e.g., 50:1) mixture. Following the HF cleaning process, the substrate 300 can be rinsed in de-ionized (D.I.) water prior to the oxidation process.

In step 104, a process gas containing $H_2$, an oxygen-containing gas, and a halogen-containing oxidation accelerant gas is exposed to the substrate 300, where the process gas is maintained at a subatmospheric pressure during the exposing. The process gas can further include an inert gas, including Ar, He, Ne, Kr, Xe, or $N_2$, or a combination of two or more thereof, but this is not required for embodiments of the invention. According to an embodiment of the invention, the oxygen-containing gas can contain $O_2$, $O_3$, NO, $NO_2$, or $N_2O$, or a combination of two or more thereof. Furthermore, the halogen-containing oxidation accelerant gas can contain $X_2$, $C_xX_y$, or $C_xX_yH_z$, or a combination thereof. The $X_2$ can, for example, contain $F_2$, $Cl_2$, $Br_2$, or $I_2$, or a combination of two or more thereof. The $C_xX_y$ can, for example, contain $C_5F_8$, $C_4F_6$, $C_4F_8$, or $CF_4$, or a combination of two or more thereof. The $C_xX_yH_z$ can, for example, contain $CHF_3$, $CH_2F_2$, $CHCl_3$, or $CH_2Cl_2$, or a combination of two or more thereof. In general, the halogen-containing oxidation accelerant gas may be selected from gases having lower activation energies for decomposition than $H_2$ and/or the oxygen-containing gas.

According to one embodiment of the invention, the halogen-containing oxidation accelerant gas in step 104 can contain HX and the process gas can be maintained at a subatmospheric pressure greater than 1 Torr during the exposing. The HX can, for example, contain HF, HCl, HBr, or HI, or a combination of two or more thereof.

According to an embodiment of the invention, the volume percentages of one or more of the $H_2$, the oxygen-containing gas, and the halogen containing accelerant gas can be varied over wide concentration ranges while achieving acceptable oxidation rates of the substrate. Suitable relative concentrations of $H_2$, the oxygen-containing gas, and the halogen containing accelerant gas that enable growth of an oxide layer with a desired oxidation rate, thickness, thickness uniformity, and electrical properties, can be determined by direct experimentation and/or design of experiments (DOE).

According to one embodiment of the invention, the combined volume percentage of the $H_2$ and the halogen-containing oxidation accelerant gas in the process gas can be between about 1 percent and about 66 percent, and the volume percent of the oxygen-containing gas alone or with an inert gas can be between about 99 percent and about 34 percent. According to another embodiment of the invention, the combined volume percentage of the $H_2$ and the halogen-containing oxidation accelerant gas in the process gas can be between about 5 percent and about 30 percent, and the volume percent of the oxygen-containing gas alone or with an inert gas can be between about 95 percent and about 70 percent. According to yet another embodiment of the invention, the combined volume percentage of the $H_2$ and the halogen-containing oxidation accelerant gas in the process gas can be between about 10 percent and about 20 percent, and the volume percent of the oxygen-containing gas alone or with an inert gas is between about 90 percent and about 80 percent. These and other volume ratios may be implemented to achieve different oxide growth rates. For example, an increase volume percentage of $H_2$ will generally provide a reduced oxidation rate and less oxidation on a nitride substrate surface.

According to one embodiment of the invention, the volume percentage of the halogen-containing accelerant gas in the process gas can be between about 0.01 percent and about 65 percent. According to another embodiment of the invention, the volume percentage of the halogen-containing accelerant gas in the process gas can be between about 0.1 percent and about 10 percent. According to yet another embodiment of the invention, the volume percentage of the halogen-containing accelerant gas in the process gas can be between about 0.5 percent and about 5 percent. Other volume percentages of reactant gases may be implemented by one of ordinary skill in the art without departing from the scope of the present invention.

In step 106, an oxide layer 302 is formed through thermal oxidation of the substrate 300 by the process gas. According to one embodiment of the invention, the substrate 300 can contain Si and the oxide layer 302 can contain $SiO_2$, or $SiO_x$ where x<2. According to another embodiment of the invention, the substrate can contain $Si_yGe_{1-y}$ and the oxide layer can contain $Si_yGe_{1-y}O_x$ where 0<y<1 and x≦2. According to yet another embodiment of the invention, the substrate 300 can contain Ge and the oxide layer 302 can contain $GeO_2$, or $GeO_x$ where x<2. According to still another embodiment of the invention, the substrate 300 can contain GaAs and the oxide layer 302 can contain oxidized GaAs.

Suitable process conditions that enable growth of the oxide layer 302 to a desired thickness and thickness uniformity can be determined by direct experimentation and/or design of experiments. It is envisioned that oxide layers having thicknesses of about 5 angstrom to about 500 angstrom may be formed. For example, thin oxide layers with thicknesses less than about 30 angstrom may used as gate dielectric oxide layers. In another example, thick oxide layers with thicknesses between about 100 angstrom and about 500 angstrom may be used as gate oxide spacers and pad oxides. Thus, according to an embodiment of the invention, a thickness of the oxide layer 302 can be between about 5 angstrom and about 30 angstrom. Alternately, a thickness of the oxide layer 302 can be between about 100 angstrom and about 500 angstrom.

For example, adjustable process parameters can include exposure time, substrate temperature, process chamber pressure, and composition of the process gas. For example, in step 104, the substrate 300 can be maintained at a temperature between about 150° C. and about 900° C. Other process parameters in step 104 include maintaining the process chamber at a pressure less than atmospheric pressure during the exposing. In one example, the process chamber can be maintained at a pressure between about 100 mTorr and about 650 Torr during the exposing. Alternately, the process chamber can be maintained at a pressure between about 200 mTorr and about 20 Torr during the exposing. Yet alternatively, the process chamber can be maintained at pressure between about 400 mTorr and about 10 Torr during the exposing. It is to be understood that process pressure may depend on the reactants used and/or process parameters.

Figure 2:
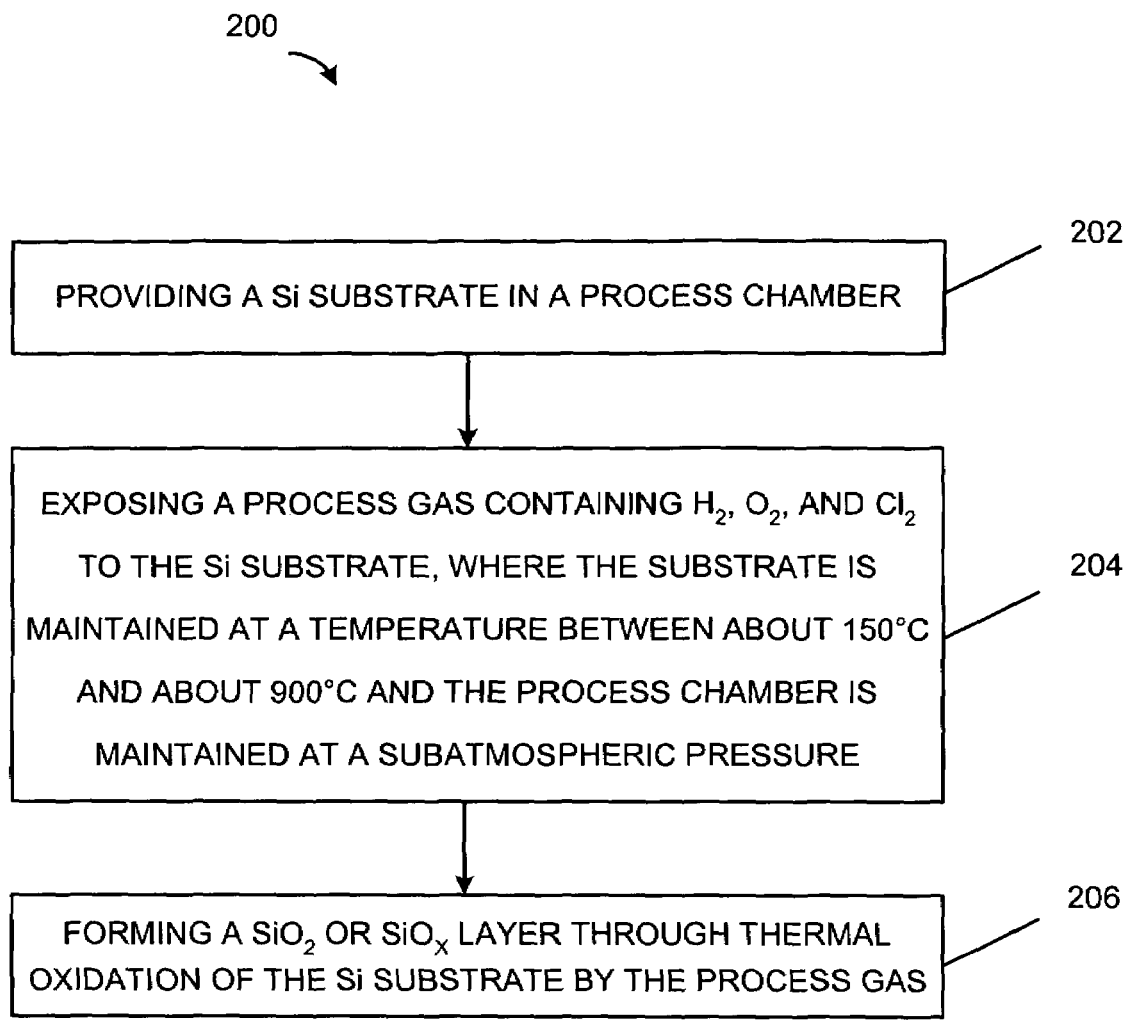
FIG. 2 is a process flow diagram of a method of forming an oxide layer according to another embodiment of the invention.

FIG. 2 is a process flow diagram for forming an oxide layer according to another embodiment of the invention. In step 202 of the process 200, a Si substrate is provided in a process chamber of a processing system. In step 204, a process gas containing $H_2$, $O_2$, and a $Cl_2$ oxidation accelerant gas is exposed to the substrate, where the process chamber is maintained at subatmospheric pressure. In step 206, a $SiO_2$ or $SiO_x$ layer is formed through thermal oxidation of the Si substrate by the process gas. For example, in step 204, the substrate can be maintained at a temperature between about 150° C. and about 900° C.

Figure 4A:
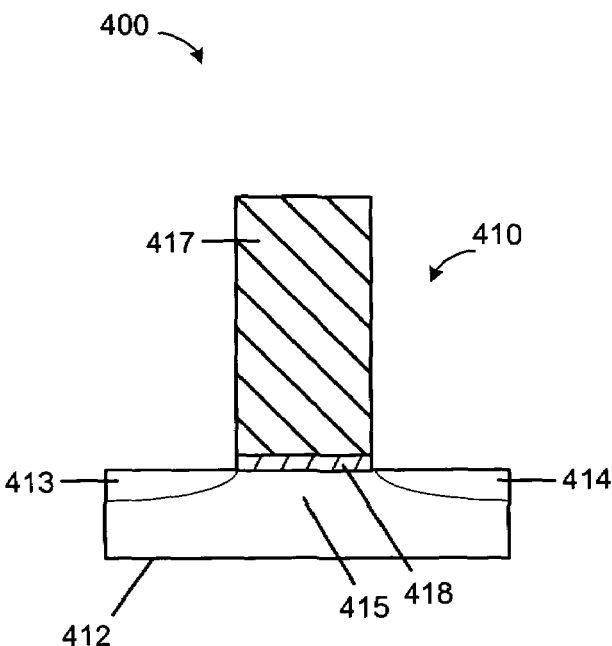
FIG. 4A schematically shows a cross-sectional view of a microstructure according to an embodiment of the invention.
Figure 4B:
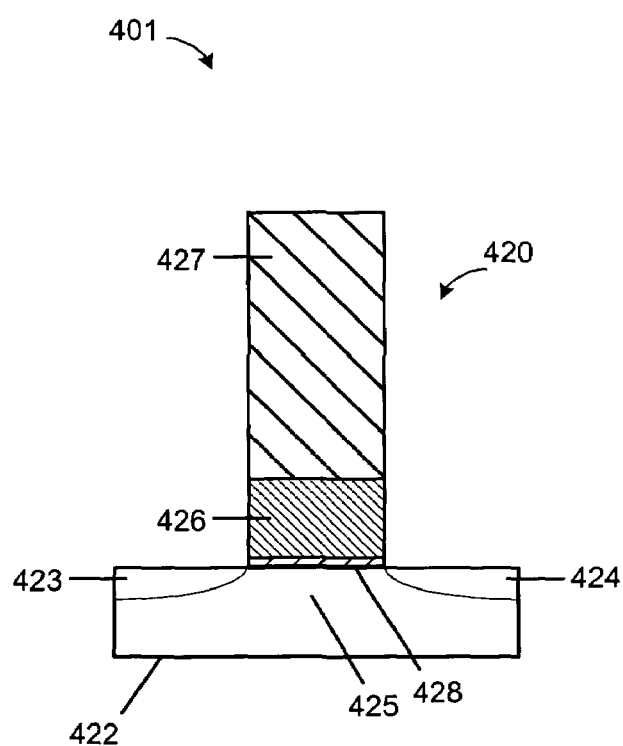
FIG. 4B schematically shows a cross-sectional view of another microstructure according to an embodiment of the invention.

FIGS. 4A and 4B schematically shows cross-sectional views of microstructures according to embodiments of the invention. The microstructures contain oxide layers that may be formed according to embodiments of the invention. The oxide layers may utilized as dielectric layers in gate stacks, for example, as a gate dielectric oxide layer 418 depicted in FIG. 4A, or as an oxide interface layer 428 integrated with a high-k material depicted in FIG. 4B. Dielectric materials featuring a dielectric constant greater than that of $SiO_2$ (k~3.9) are commonly referred to as high-k materials. A high-k layer can, for example, contain a metal oxide, a metal oxynitride, a metal silicate, or a nitrated metal silicate, including $Ta_2O_5$, $TaSiO_x$, $TaSiO_xN_y$, $TiO_2$, $ZrO_2$, $Al_2O_3$, $Y_2O_3$, $HfO_2$, $HfSiO_x$, $HfSiO_xN_y$, $HfO_xN_y$, $ZrO_2$, $ZrSiO_x$, $ZrSiO_xN_y$, $ZrO_xN_y$, $SrO_x$, $SrSiO_x$, $SrSiO_xN_y$, $LaO_x$, $LaSiO_x$, $LaSiO_xN_y$, $YO_x$, $YSiO_x$, or $YSiO_xN_y$, or combination or mixture of two or more thereof.

In current semiconductor devices, one function of a dielectric layer in a gate stack is to "gate" the electrons, by controlling the flow of electricity across the transistor. With the introduction of high-k materials, these oxide layers will likely still be required at the channel and/or gate electrode to preserve interface state characteristics. This can include forming an interface oxide layer with good electrical properties, preventing uncontrolled Si surface oxidation, reducing reactions between different layers, and acting as a barrier layer to prevent diffusion of atoms to the different layers (e.g., dopant penetration from a gate electrode layer into the substrate). In practice, good device performance depends on controlling the thickness of the oxide layer, such that it remains thin, thereby avoiding increasing the equivalent oxide thickness (EOT) of the gate structure.

In FIG. 4A, the microstructure 400 contains a gate stack 410 and a substrate 412 having a source region 413, a drain region 414, and a channel region 415. The gate stack 410 contains a gate dielectric oxide layer 418 formed on the substrate 412, and a gate electrode layer 417 formed on the gate dielectric oxide layer 418. The gate dielectric oxide layer 418 can be formed through thermal oxidation of the substrate 412 by a process gas containing $H_2$, an oxygen-containing gas, and a halogen-containing oxidation accelerant gas as described in reference to FIGS. 1-3 above. The substrate 412 can, for example, contain Si, Ge, SiGe, or GaAs. According to one embodiment of the invention, the substrate 412 can contain Si and the gate dielectric oxide layer 418 can contain $SiO_2$ or $SiO_x$ where x<2. According to another embodiment of the invention, the substrate can contain $Si_yGe_{1-y}$ and the gate dielectric oxide layer 418 can contain $Si_yGe_{1-y}O_x$ where 0<y<1 and x≦2. According to yet another embodiment of the invention, the substrate 412 can contain Ge and the gate dielectric oxide layer 418 can contain $GeO_2$ or $GeO_x$ where x<2. The thickness of the gate dielectric oxide layer 418 can, for example be between about 5 angstrom and about 30 angstrom, but this is not required for embodiments of the invention as the oxide layer 418 can have other thicknesses. Alternately, a thickness of the gate dielectric oxide layer 418 can be between about 7 angstrom and about 15 angstrom. The gate electrode layer 417 can, for example, be about 1000 angstrom thick. The gate electrode layer 417 can contain silicon (e.g., doped poly-Si), or a metal or metal-containing material, including W, WN, Al, Mo, Ta, TaN, TaSiN, HfN, HfSiN, Ti, TiN, TiSiN, Mo, MoN, Re, or Ru.

In FIG. 4B, the microstructure 401 contains a gate stack 420 and a substrate 422 having a source region 423, a drain region 424, and a channel region 425. The gate stack 420 contains an oxide interface layer 428 formed on the substrate 422, and a gate electrode layer 427 formed on the oxide interface layer 428. The oxide interface layer 428 can be formed through thermal oxidation of the substrate 422 by a process gas containing $H_2$, an oxygen-containing gas, and a halogen-containing oxidation accelerant gas. As described in reference to substrate 412 in FIG. 4A, the substrate 422 in FIG. 4B can, for example, contain Si, Ge, or SiGe, or GaAs. The thickness of the oxide interface layer 428 can, for example be between about 5 angstrom and about 30 angstrom, but this is not required for embodiments of the invention as the oxide interface layer 428 can have other thicknesses. Alternately, a thickness of the oxide interface layer 428 can be between about 7 angstrom and about 15 angstrom. The oxide interface layer 428 can be thinner than the oxide interface layer 418 and the high-k layer 427 can be physically thicker than the oxide dielectric layer 418, while attaining the necessary capacitance in the gate stack 420. The high-k layer 426 can, for example, be between about 10 angstrom and about 200 angstrom thick. Alternately, the thickness of the high-k layer 426 can be between about 20 angstrom and about 50 angstrom.

Figure 5:
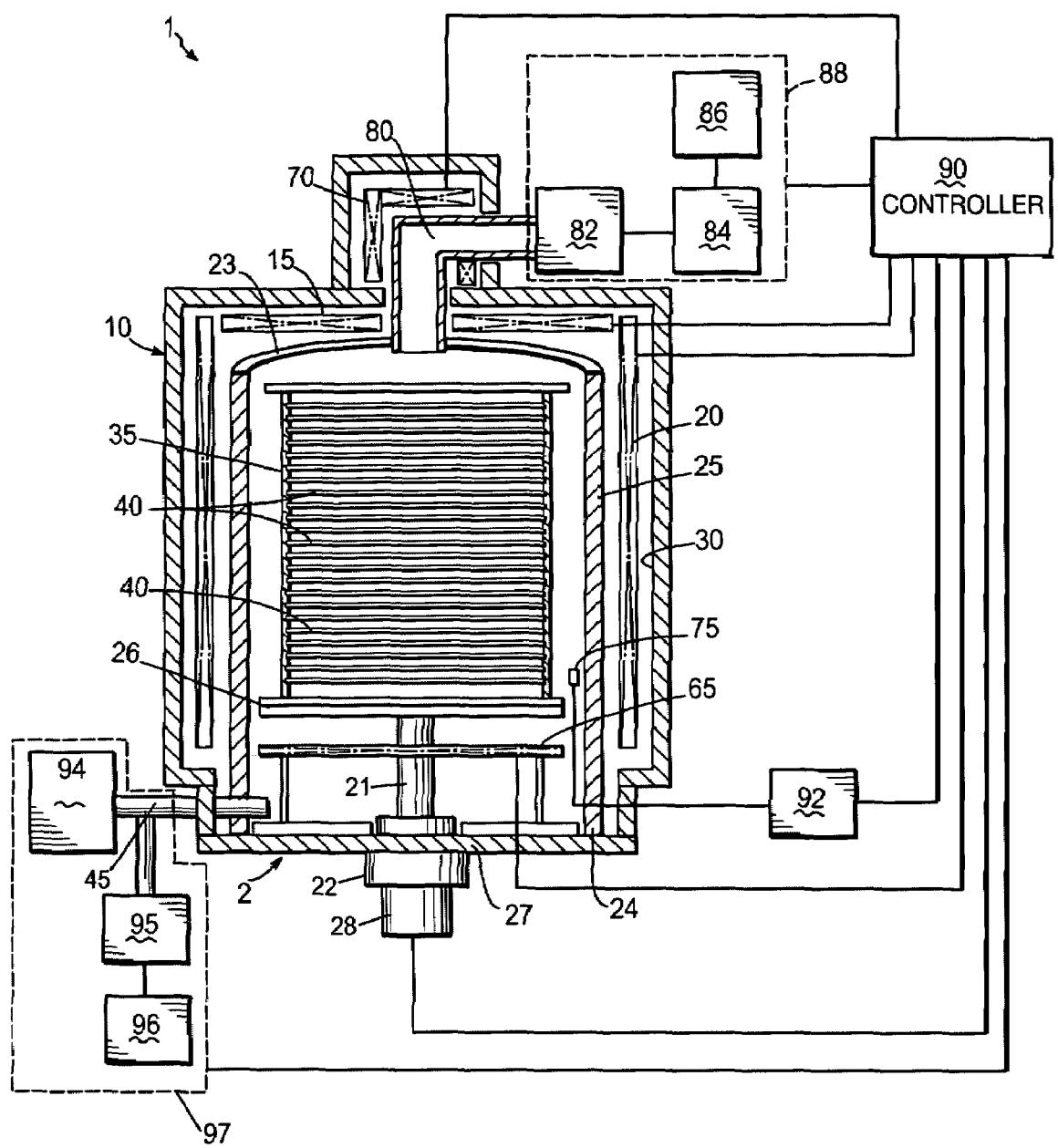
FIG. 5 shows a schematic view of a batch processing system for forming an oxide layer according to an embodiment of the invention.

FIG. 5 shows a simplified block diagram of a batch processing system for forming an oxide layer according to an embodiment of the invention. The batch processing system 1 contains a process chamber 10 and a process tube 25 that has an upper end 23 connected to an exhaust pipe 80, and a lower end 24 hermetically joined to a lid 27 of cylindrical manifold 2. The exhaust pipe 80 discharges gases from the process tube 25 to a vacuum pumping system 88 to maintain a pre-determined subatmospheric pressure in the processing system 1. A substrate holder 35 for holding a plurality of substrates (wafers) 40 in a tier-like manner (in respective horizontal planes at vertical intervals) is placed in the process tube 25. The substrate holder 35 resides on a turntable 26 that is mounted on a rotating shaft 21 penetrating the lid 27 and driven by a motor 28. The turntable 26 can be rotated during processing to improve overall film uniformity or, alternately, the turntable can be stationary during processing. The lid 27 is mounted on an elevator 22 for transferring the substrate holder 35 in and out of the process tube 25. When the lid 27 is positioned at its uppermost position, the lid 27 is adapted to close the open end of the manifold 2.

A gas delivery system 97 is configured for introducing gases into the process chamber 10. A plurality of gas supply lines can be arranged around the manifold 2 to supply a plurality of gases into the process tube 25 through the gas supply lines. In FIG. 5, only one gas supply line 45 among the plurality of gas supply lines is shown. The gas supply line 45 shown, is connected to a first gas source 94. In general, the first gas source 94 can supply gases for processing the substrates 40, including $H_2$, an oxygen-containing gas, and an a halogen-containing oxidation accelerant gas for forming an oxide layer on the substrates 40. Furthermore, the first gas source 94 can supply an inert gas. In addition, or in the alternate, one or more gases can be supplied from the (remote) plasma source 95 that is operatively coupled to a second gas source 96 and to the process chamber 10 by the gas supply line 45. The plasma-excited gas is introduced into the process tube 25 by the gas supply line 45. The plasma source 95 can, for example, be a microwave plasma source, a radio frequency (RF) plasma source, or a plasma source powered by light radiation. In the case of a microwave plasma source, the microwave power can be between about 500 Watts (W) and about 5,000 W. The microwave frequency can, for example, be 2.45 GHz or 8.3 GHz. In one example, the remote plasma source can be a Downstream Plasma Source Type AX7610, manufactured by MKS Instruments, Wilmington, Mass., USA.

A cylindrical heat reflector 30 is disposed so as to cover the reaction tube 25. The heat reflector 30 has a mirror-finished inner surface to suppress dissipation of radiation heat radiated by main heater 20, bottom heater 65, top heater 15, and exhaust pipe heater 70. A helical cooling water passage (not shown) can be formed in the wall of the process chamber 10 as a cooling medium passage. The heaters 20, 65, and 15 can, for example, maintain the temperature of the substrates 40 between about 20° C. and about 900° C.

The vacuum pumping system 88 comprises a vacuum pump 86, a trap 84, and automatic pressure controller (APC) 82. The vacuum pump 86 can, for example, include a dry vacuum pump capable of a pumping speed up to 20,000 liters per second (and greater). During processing, gases can be introduced into the process chamber 10 via the gas supply line 45 of the gas delivery system 97 and the process pressure can be adjusted by the APC 82. The trap 84 can collect unreacted precursor material and by-products from the process chamber 10.

The process monitoring system 92 comprises a sensor 75 capable of real-time process monitoring and can, for example, include a mass spectrometer (MS), a FTIR spectrometer, or a particle counter. A controller 90 includes a microprocessor, a memory, and a digital I/O port capable of generating control voltages sufficient to communicate and activate inputs to the processing system 1 as well as monitor outputs from the processing system 1. Moreover, the controller 90 is coupled to and can exchange information with gas delivery system 97, motor 28, process monitoring system 92, heaters 20, 15, 65, and 70, and vacuum pumping system 88. The controller 90 may be implemented as a DELL PRECISION WORKSTATION 610™. The controller 90 may also be implemented as a general purpose computer, processor, digital signal processor, etc., which causes a substrate processing apparatus to perform a portion or all of the processing steps of the invention in response to the controller 90 executing one or more sequences of one or more instructions contained in a computer readable medium. The computer readable medium or memory for holding instructions programmed according to the teachings of the invention and for containing data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

The controller 90 may be locally located relative to the processing system 1, or it may be remotely located relative to the processing system 1 via an internet or intranet. Thus, the controller 90 can exchange data with the processing system 1 using at least one of a direct connection, an intranet, and the internet. The controller 90 may be coupled to an intranet at a customer site (i.e., a device maker, etc.), or coupled to an intranet at a vendor site (i.e., an equipment manufacturer). Furthermore, another computer (i.e., controller, server, etc.) can access controller 90 to exchange data via at least one of a direct connection, an intranet, and the internet.

It is to be understood that the batch processing system 1 depicted in FIG. 5 is shown for exemplary purposes only, as many variations of the specific hardware can be used to practice embodiments of the invention, and these variations will be readily apparent to one having ordinary skill in the art. The processing system 1 in FIG. 5 can, for example, process substrates of any size, such as 200 mm substrates, 300 mm substrates, or even larger substrates. Furthermore, the processing system 1 can simultaneously process up to about 200 substrates, or more. Alternately, the processing system 1 can simultaneously process up to about 25 substrates.

Alternately, a single wafer deposition system may be used to form an oxide layer according to embodiments of the invention. One example of a single wafer deposition system is described in U.S. patent application Ser. No. 11/711,721, titled "A METHOD FOR FORMING A THIN COMPLETE HIGH-PERMITTIVITY DIELECTRIC LAYER", filed on Sep. 30, 2004, the entire contents of which are hereby incorporated by reference.

It should be understood that various modifications and variations of the present invention may be employed in practicing the invention. It is therefore to be understood that, within the scope of the appended claims, the invention may be practiced otherwise than as specifically described herein.

What is claimed is:

1. A method for processing a substrate, the method comprising:
   providing the substrate in a process chamber;
   maintaining the substrate at a temperature between about 150° C. and about 900° C.;
   maintaining the process chamber at a pressure between about 100 mTorr and about 20 Torr;
   exposing a process gas comprising $H_2$, an oxygen-containing gas, and a halogen-containing oxidation accelerant gas to the substrate, wherein the process chamber is maintained at said temperature and said pressure during the exposing; and
   forming an oxide layer through thermal oxidization of the substrate by the process gas.

2. The method according to claim 1, wherein the halogen-containing oxidation accelerant gas comprises $X_2$, $C_xX_y$, or $C_xX_yH_z$, or a combination of two or more thereof.

3. The method according to claim 2, wherein the substrate is maintained at a temperature between about 400° C. about 800° C. during the exposing.

4. The method according to claim 2, wherein the process chamber is maintained at a pressure between about 200 mTorr and about 20 Torr during the exposing.

5. The method according to claim 2, wherein the process chamber is maintained at a pressure between about 400 mTorr and about 10 Torr during the exposing.

6. The method according to claim 2, wherein the oxygen-containing gas comprises $O_2$, $O_3$, $NO$, $NO_2$, or $N_2O$, or a combination of two or more thereof.

7. The method according to claim 2, wherein the $X_2$ comprises $F_2$, $Cl_2$, $Br_2$, or $I_2$, or a combination of two or more thereof.

8. The method according to claim 2, wherein the $C_xX_y$ comprises $C_5F_8$, $C_4F_6$, $C_4F_8$, or $CF_4$, or a combination of two or more thereof, and the $C_xH_yX_z$ comprises $CHF_3$, $CH_2F_2$, $CHCl_3$, or $CH_2Cl_2$, or a combination of two or more thereof.

9. The method according to claim 2, wherein the process gas further comprises Ar, He, Ne, Kr, Xe, or $N_2$, or a combination of two or more thereof.

10. The method according to claim 2, wherein the substrate comprises Si and the oxide layer comprises $SiO_2$ or $SiO_x$ where x<2.

11. The method according to claim 2, wherein the substrate comprises Ge and the oxide layer comprises $GeO_2$ or $GeO_x$ where x<2.

12. The method according to claim 2, wherein the substrate comprises $Si_yGe_{1-y}$, and the oxide layer comprises $Si_yGe_{1-y}O_x$ with 0<y<1 and x≦2.

13. The method according to claim 2, wherein the substrate comprises GaAs and the oxide layer comprises oxidized GaAs.

14. The method according to claim 2, wherein a thickness of the oxide layer is between about 5 angstrom and about 500 angstrom.

15. The method according to claim 2, wherein a thickness of the oxide layer is between about 5 angstrom and about 30 angstrom.

16. The method according to claim 2, wherein a thickness of the oxide layer is between about 100 angstrom and about 500 angstrom.

17. The method according to claim 2, wherein the combined volume percentage of the $H_2$ and the halogen-containing oxidation accelerant gas in the process gas is between about 1 percent and about 66 percent, and wherein the combined volume percentage of the oxygen-containing gas and optionally an inert gas is between about 99 percent and about 34 percent.

18. The method according to claim 2, wherein the volume percentage of the halogen-containing accelerant gas in the process gas is between about 0.01 percent and about 65 percent.

19. The method of claim 1, wherein said providing comprises providing a si substrate having at least one diffusion region therein, said exposing and forming being performed on the substrate having at least one diffusion region.

20. A method for processing a Si substrate, the method comprising:
   providing the Si substrate in a process chamber;
   exposing a process gas comprising $H_2$, $O_2$, and a $Cl_2$ oxidation accelerant gas to the Si substrate, wherein the Si substrate is maintained at a temperature between about 150° C. and about 900° C. and the process chamber is maintained at a subatmospheric pressure between about 100 mTorr and 20 Torr during the exposing; and
   forming an $SiO_2$ or $SiO_x$ layer through thermal oxidization of the Si substrate by the process gas.

21. The method of claim 20, wherein said providing comprises providing a Si substrate having at least one diffusion region therein, said exposing and forming being performed on the Si substrate having at least one diffusion region.

* * * * *